(12) United States Patent
Ando (10) Patent No.: US 11,217,429 B2
(45) Date of Patent: *Jan. 4, 2022

(54) PLASMA PROCESSING DEVICE

(71) Applicant: NISSIN ELECTRIC CO., LTD., Kyoto (JP)

(72) Inventor: Yasunori Ando, Kyoto (JP)

(73) Assignee: NISSIN ELECTRIC CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/767,120

(22) PCT Filed: Nov. 30, 2018

(86) PCT No.: PCT/JP2018/044161
§ 371 (c)(1),
(2) Date: May 27, 2020

(87) PCT Pub. No.: WO2019/107540
PCT Pub. Date: Jun. 6, 2019

(65) Prior Publication Data
US 2020/0373123 A1  Nov. 26, 2020

(30) Foreign Application Priority Data

Dec. 1, 2017  (JP) .............................. JP2017-231374

(51) Int. Cl.
*H01J 37/32* (2006.01)
*H01Q 1/02* (2006.01)

(52) U.S. Cl.
CPC ..... *H01J 37/3211* (2013.01); *H01J 37/32568* (2013.01); *H01Q 1/02* (2013.01); *H01J 2237/002* (2013.01)

(58) Field of Classification Search
CPC .. H01J 37/32568; H01J 21/31; H01J 21/3065; H01J 37/3211; H01J 2237/002;
(Continued)

(56) References Cited

U.S. PATENT DOCUMENTS 6,690,568 B2 * 2/2004 Johnson ............... H01G 5/0132
361/272
2003/0090853 A1  5/2003 Johnson
(Continued)

FOREIGN PATENT DOCUMENTS

CN    1347126      5/2002
CN    105491780    4/2016
(Continued)

OTHER PUBLICATIONS

"International Search Report (Form PCT/ISA/210) of PCT/JP2018/044161," dated Feb. 5, 2019, with English translation thereof, pp. 1-4.
(Continued)

*Primary Examiner* — Yuechuan Yu
(74) *Attorney, Agent, or Firm* — JCIPRNET (57) ABSTRACT

An antenna conductor is cooled to stably generate plasma, and unexpected fluctuation in the electrostatic capacity of a variable capacitor connected to the antenna conductor is suppressed while cooling the variable capacitor. A plasma processing device which generates plasma in a vacuum container and processes a substrate by using the plasma is provided. The plasma processing device includes: an antenna conductor through which a high-frequency current is caused to flow to generate plasma, and a variable capacitor which is electrically connected to the antenna conductor. The antenna conductor has a flow path in which a cooling
(Continued)

liquid flows. A dielectric of the variable capacitor is constituted of the cooling liquid flowing through the antenna conductor.

11 Claims, 7 Drawing Sheets

(58) Field of Classification Search
CPC ............ H05H 1/46; H01Q 1/02; H01Q 13/12; H01Q 1/22; B29C 59/14; C23C 16/509
See application file for complete search history.

(56) References Cited

U.S. PATENT DOCUMENTS

| | | | |
|---|---|---|---|
| 2006/0197624 A1* | 9/2006 | Jue | H03H 7/40 333/32 |
| 2014/0062296 A1* | 3/2014 | Yamazawa | H01J 37/32119 315/34 |

FOREIGN PATENT DOCUMENTS

| | | | |
|---|---|---|---|
| JP | 10074600 A | * | 3/1998 |
| JP | H11162696 | | 6/1999 |
| JP | H11317299 | | 11/1999 |
| JP | 2001060581 | | 3/2001 |
| JP | 2002541336 | | 12/2002 |
| JP | 2012238881 | | 12/2012 |
| JP | 2017004602 | | 1/2017 |
| JP | 2017033788 | | 2/2017 |

OTHER PUBLICATIONS

"Office Action of Korea Counterpart Application", dated Aug. 23, 2021, with English translation thereof, p. 1-p. 11.

"Office Action of China Counterpart Application", dated Nov. 1, 2021, with English translation thereof, p. 1-p. 19.

* cited by examiner

PLASMA PROCESSING DEVICE

CROSS-REFERENCE TO RELATED APPLICATION

This application is a 371 application of an international PCT application serial no. PCT/JP2018/044161, filed on Nov. 30, 2018, which claims the priority benefit of Japan application JP2017-231374, filed on Dec. 1, 2017. The entirety of each of the abovementioned patent applications is hereby incorporated by reference herein and made a part of this specification.

BACKGROUND

Technical Field

The present invention relates to a plasma processing device for generating plasma in a vacuum container and processing a substrate by using the plasma.

Related Art

Conventionally, a plasma processing device has been proposed in which a high frequency current is applied to an antenna to generate an induced electric field, an inductively coupled plasma (abbreviated as ICP) is generated by the induced electric field, and a substrate W is processed by using the inductively coupled plasma.

As shown in Patent literature 1, a device in which a plurality of internal linear antennas are arranged in a plasma generation chamber and floating capacitors or intermediate capacitors are connected between the internal linear antennas and the ground or between the internal linear antennas is being considered as the plasma processing device described above.

In the above plasma processing device, the floating capacitors or the intermediate capacitors have variable capacity. Then, by changing the capacity of the floating capacitors or the intermediate capacitors, the high frequency voltage distribution above the internal linear antennas or the like is varied, and the electrostatic coupling between the internal linear antennas and the plasma is controlled.

However, the relative permittivity of the floating capacitor or the intermediate capacitor is varied due to heat generated during plasma generation. As a result, the electrostatic capacity of the floating capacitor or the intermediate capacitor may be varied unexpectedly.

In addition, the temperature of the internal linear antennas become high due to the heat generated during plasma generation, and it is difficult to stably generate plasma due to damage to the antennas or damage to surrounding structures.

LITERATURE OF RELATED ART

Patent Literature

Patent literature 1: Japanese Patent Laid-Open No. 11-317299

SUMMARY

Problems to be Solved

Therefore, the present invention has been made to solve the above-mentioned problems, and the main purpose is to cool an antenna conductor to stably generate plasma, and to suppress unexpected fluctuation in the electrostatic capacity of a variable capacitor connected to the antenna conductor while cooling the variable capacitor.

Means to Solve Problems

That is, the plasma processing device according to the present invention is a plasma processing device for generating plasma in a vacuum container and processing a substrate by using the plasma. The plasma processing device includes an antenna conductor through which a high frequency current is caused to flow to generate plasma, and a variable capacitor which is electrically connected to the antenna conductor. The antenna conductor has therein a flow path in which a cooling liquid flows, and a dielectric of the variable capacitor is constituted of the cooling liquid flowing through the antenna conductor.

With the above plasma processing device, the antenna conductor can be cooled by the cooling liquid, and thus plasma can be stably generated. In addition, the dielectric of the variable capacitor is constituted of the cooling liquid flowing through the antenna conductor, and thus the unexpected fluctuation of the electrostatic capacity of the variable capacitor can be suppressed while cooling the variable capacitor.

Generally, the cooling liquid is adjusted to a constant temperature by a temperature adjustment mechanism, and by using this cooling liquid as a dielectric, a change in the relative permittivity caused by temperature change can be suppressed and a change in electrostatic capacity occurred along with the change in the relative permittivity can also be suppressed. Furthermore, when water is used as the cooling liquid, the relative permittivity of water is about 80 (20° C.), and a variable capacitor that can withstand high voltage can be configured.

Preferably, the variable capacitor includes a first fixed electrode electrically connected to the antenna conductor, a second fixed electrode electrically connected to an antenna conductor different from the above antenna conductor or grounded, and a movable electrode that forms a first capacitor with the first fixed electrode and forms a second capacitor with the second fixed electrode.

With this configuration, it is not necessary to connect an external circuit element (for example, an antenna conductor or ground) to the movable electrode. As a result, this eliminates the need for a connector in which a slider (brush) that brings the movable electrode into contact with the external circuit element is applied, and can reduce connection failure caused by the connector in which the slider is applied.

Preferably, the movable electrode rotates about a predetermined rotation shaft, and the first fixed electrode and the second fixed electrode are arranged at different positions around the rotation shaft.

With this configuration, the first fixed electrode and the second fixed electrode are arranged around the rotation shaft, and the axial dimension of the rotation shaft can be made compact.

Preferably, the first fixed electrode and the second fixed electrode are arranged at positions symmetrical with respect to the rotation shaft and have the same shape. The movable electrode has a first movable metal plate facing the first fixed electrode and a second movable metal plate facing the second fixed electrode, and the first movable metal plate and the second movable metal plate are arranged at positions symmetrical with respect to the rotation shaft and have the same shape.

With this configuration, when the movable electrode is rotated, the amount of change in the electrostatic capacity of the first capacitor and the amount of change in the electrostatic capacity of the second capacitor can be made the same. As a result, the electrostatic capacity can be adjusted easily. In addition, because the metal plates forming the fixed electrodes have the same shape and the movable metal plates of the movable electrode have the same shape, the number of components can be reduced.

Preferably, each of the first fixed electrode and the second fixed electrode has a plurality of fixed metal plates arranged facing each other, a plurality of the first movable metal plates are arranged corresponding to the plurality of fixed metal plates that form the first fixed electrode, and a plurality of the second movable metal plates are arranged corresponding to the plurality of fixed metal plates that form the second fixed electrode.

With this configuration, the maximum value of the facing area between the electrodes can be increased without increasing the areas of the fixed metal plates and the movable metal plates.

Preferably, the first movable metal plate and the second movable metal plate have a fan shape that expands radially outward from the rotation shaft in a plan view, the fixed metal plate has a shape which is gradually reduced in width toward the rotation shaft in a plan view, the reduced end edge of the metal plate is formed along the radial direction of the rotation shaft, and the front end edge on the rotation shaft side has an arc shape.

With this configuration, the electrostatic capacity can be adjusted in proportion to the rotation angle of the movable electrode.

Preferably, the variable capacitor includes a storage container being insulative and storing the first fixed electrode, the second fixed electrode and the movable electrode, the storage container has an inlet port for introducing the cooling liquid and an outlet port for discharging the cooling liquid, and the inlet port and the outlet port are arranged at positions facing each other.

With this configuration, the cooling liquid easily flows inside the storage container. As a result, the replacement of the cooling liquid in the storage container is facilitated, and the variable capacitor can be cooled efficiently.

Preferably, the direction in which the first fixed electrode and the second fixed electrode face the movable electrode is orthogonal to the direction in which the inlet port faces the outlet port.

With this configuration, the cooling liquid easily flows between each electrode and the movable electrode. As a result, the replacement of the cooling liquid between each fixed electrode and the movable electrode is facilitated, and the temperature change of the cooling liquid serving as the dielectric is suppressed. Accordingly, the electrostatic capacity of the variable capacitor is easily kept constant.

In order to facilitate the attachment of each fixed electrode to the storage container, it is preferably that the first fixed electrode is inserted into the storage container from one of the inlet port or the outlet port, and the second fixed electrode is inserted into the storage container from the other of the inlet port or the outlet port.

Preferably, when the antenna conductor is arranged penetrating the vacuum container in the plasma processing device, the variable capacitor is electrically connected to an end of the antenna conductor extending to the outside of the vacuum container.

In order to process a large-area substrate in the plasma processing device, a plurality of the antenna conductors may be arranged. Here, the plurality of antenna conductors are arranged penetrating the vacuum container. In this case, it is preferable that the variable capacitor electrically connects the ends of adjacent antenna conductors extending to the outside of the vacuum container, and makes the flow paths of the adjacent antenna conductors communicate with each other.

Effect

According to the present invention configured as above, plasma can be stably generated, and the unexpected fluctuation in the electrostatic capacity of the variable capacitor can be suppressed while cooling the variable capacitor.

DESCRIPTION OF THE EMBODIMENTS

Hereinafter, an embodiment of a plasma processing device according to the present invention is described with reference to the drawings.

<Device Configuration>

A plasma processing device 100 according to the present embodiment processes a substrate W by using inductively coupled plasma P. Here, the substrate W is, for example, a substrate for a flat panel display (FPD) such as a liquid crystal display or an organic EL display, a flexible substrate for a flexible display, or the like. In addition, the processing applied to the substrate W is, for example, film formation by plasma CVD method, etching, ashing, sputtering or the like.

Moreover, the plasma processing device 100 is also called a plasma CVD device when forming a film by the plasma CVD method, a plasma etching device when performing etching, a plasma ashing device when performing ashing, and a plasma sputtering device when performing sputtering.

Figure 1:
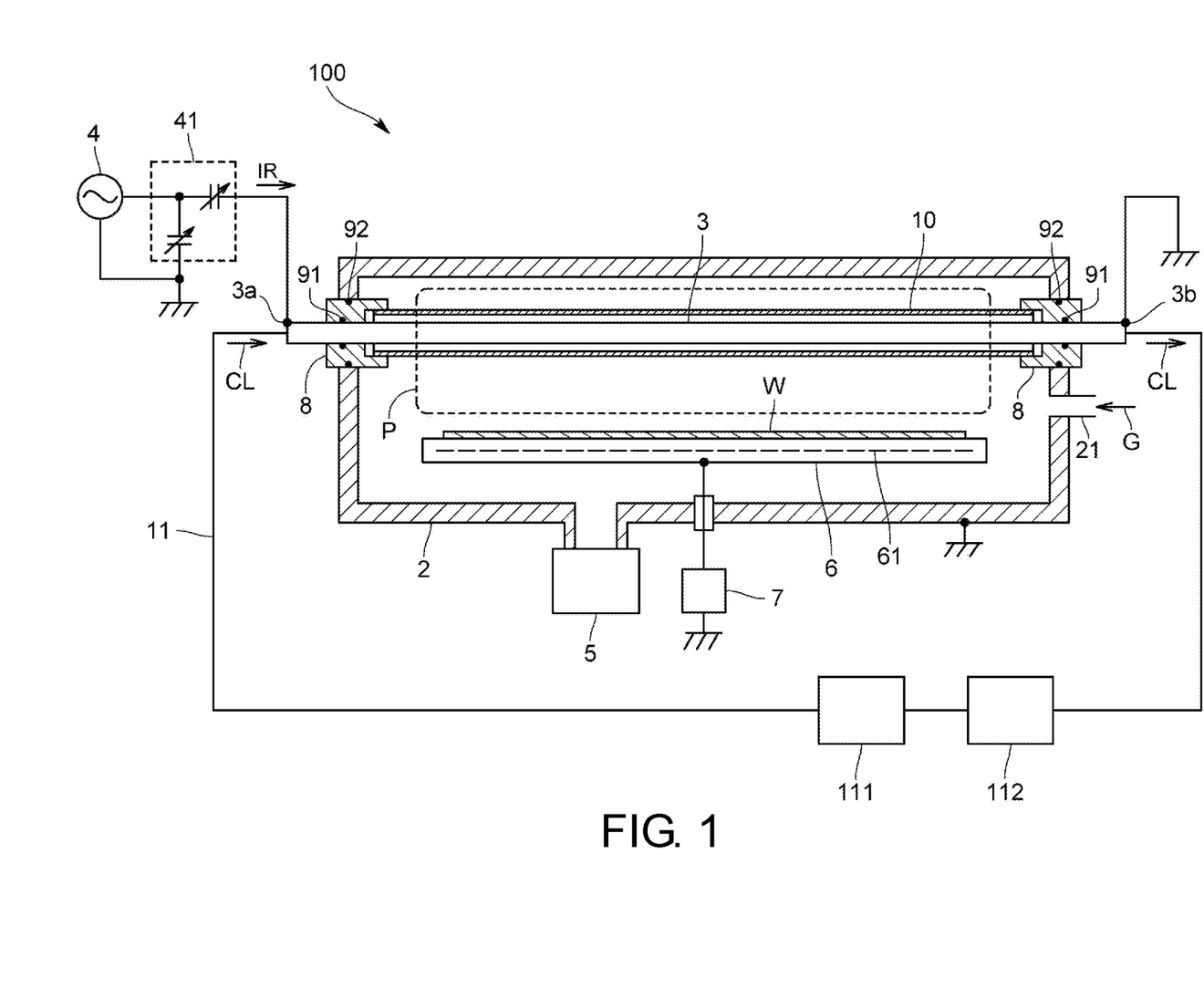
FIG. 1 is a longitudinal sectional view schematically showing a configuration of a plasma processing device of the present embodiment.
Figure 2:
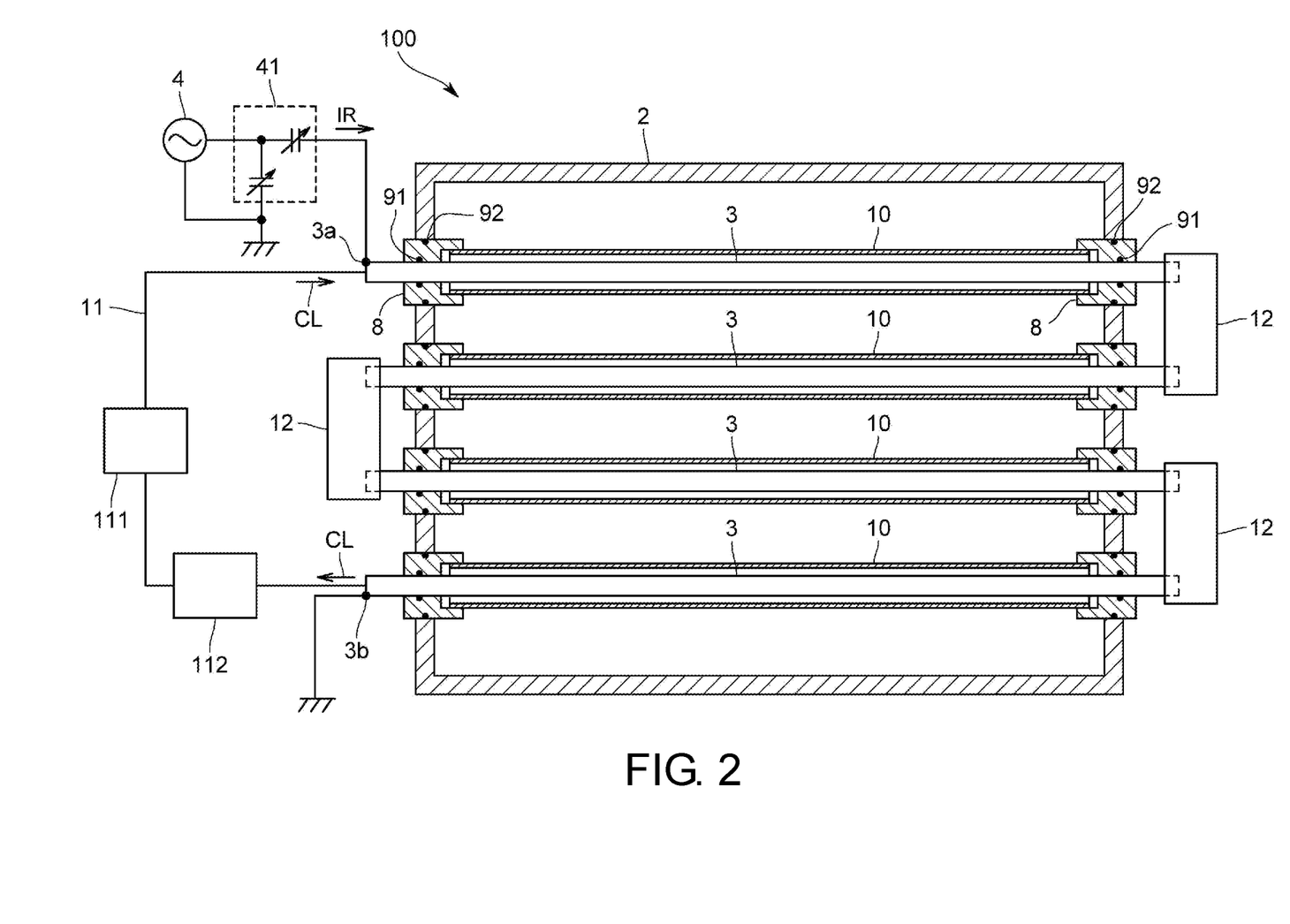
FIG. 2 is a cross-sectional view schematically showing a configuration of the plasma processing device of the above embodiment.

Specifically, as shown in FIGS. 1 and 2, the plasma processing device 100 includes a vacuum container 2 which is evacuated and into which a gas G is introduced, linear antenna conductors 3 arranged in the vacuum container 2, and a high frequency power supply 4 for applying a high frequency which is used to generate the inductively coupled plasma P in the vacuum container 2 to the antenna conductors 3. Moreover, by applying the high frequency from the high frequency power supply 4 to the antenna conductors 3, a high frequency current IR flows through the antenna conductors 3, and an induction electric field is generated in the vacuum container 2 to generate the inductively coupled plasma P.

The vacuum container 2 is, for example, a metal container, and the inside thereof is evacuated by a vacuum evacuation device 5. In this example, the vacuum container 2 is electrically grounded.

The gas G is introduced into the vacuum container 2 via, for example, a flow rate regulator (not shown) and a plurality of gas inlet ports 21 arranged in a direction along the antenna conductor 3. The gas G may be selected according to the processing content applied to the substrate W.

In addition, a substrate holder 6 for holding the substrate W is arranged in the vacuum container 2. As in this example, a bias voltage may be applied to the substrate holder 6 from a bias power supply 7. The bias voltage includes, but is not limited to, a negative direct current voltage for example. With such a bias voltage, for example, the energy when positive ions in the plasma P enter the substrate W can be controlled, and the crystallinity of the film formed on the surface of the substrate W can thereby be controlled. A heater 61 for heating the substrate W may be arranged in the substrate holder 6.

A plurality of the antenna conductors 3 are arranged above the substrate W in the vacuum container 2 along the surface of the substrate W (for example, substantially parallel to the surface of the substrate W).

The vicinity of both ends of the antenna conductor 3 penetrates the mutually opposed side walls of the vacuum container 2 respectively. Insulating members 8 are arranged at portions where the both ends of the antenna conductor 3 penetrate to the outside of the vacuum container 2. The both ends of the antenna conductor 3 penetrate the insulating members 8, and the penetrated portions are vacuum-sealed by, for example, a packing 91. The space between each insulating member 8 and the vacuum container 2 is also vacuum-sealed by, for example, a packing 92. The material of the insulating member 8 is, for example, ceramic such as alumina, quartz, or engineering plastic such as polyphenylene sulfide (PPS) and polyether ether ketone (PEEK), or the like.

Furthermore, in the antenna conductor 3, the portion located inside the vacuum container 2 is covered with a straight tubular insulating cover 10. Both ends of the insulating cover 10 are supported by the insulating members 8. Moreover, the material of the insulating cover 10 is, for example, quartz, alumina, fluororesin, silicon nitride, silicon carbide, silicon, or the like.

Then, the plurality of antenna conductors 3 have a hollow structure having therein a flow path in which a cooling liquid CL flows. In the present embodiment, the antenna conductor 3 is a metal pipe having a straight tubular shape. The material of the metal pipe is, for example, copper, aluminum, alloys thereof, stainless steel, or the like.

Moreover, the cooling liquid CL flows among the antenna conductors 3 by a circulation flow path 11 arranged outside the vacuum container 2. The circulation flow path 11 is provided with a temperature adjustment mechanism 111 such as a heat exchanger for adjusting the cooling liquid CL to a constant temperature, and a circulation mechanism 112 such as a pump for circulating the cooling liquid CL in the circulation flow path 11. From the viewpoint of electrical insulation, the cooling liquid CL is preferably high resistance water, for example, pure water or water close to pure water. Furthermore, in addition to water, a liquid refrigerant such as a fluorine-based inert liquid may also be used.

In addition, as shown in FIG. 2, the plurality of antenna conductors 3 are configured to be connected by connection conductors 12 to form one antenna structure. That is, the ends of the adjacent antenna conductors 3 extending to the outside of the vacuum container 2 are electrically connected by the connection conductor 12. Specifically, in the adjacent antenna conductors 3, the end of one antenna conductor 3 and the end of the other antenna conductor 3 are electrically connected by the connection conductor 12.

Here, the ends of the two antenna conductors 3 connected by the connection conductor 12 are ends located on the side of the same side wall. Accordingly, the plurality of antenna conductors 3 are configured such that high frequency currents in opposite directions flow in the adjacent antenna conductors 3.

Then, the connection conductor 12 has a flow path therein, and the cooling liquid CL flows through the flow path. Specifically, one end of the connection conductor 12 communicates with the flow path of one antenna conductor 3, and the other end of the connection conductor 12 communicates with the flow path of the other antenna conductor 3. Accordingly, in the adjacent antenna conductors 3, the cooling liquid CL flowing through one antenna conductor 3 flows into the other antenna conductor 3 via the flow path of the connection conductor 12. The plurality of antenna conductors 3 can thereby be cooled by the common cooling liquid CL. Additionally, because the plurality of antenna conductors 3 can be cooled by one flow path, the configuration of the circulation flow path 11 can be simplified.

One end of the plurality of antenna conductors 3 which is not connected by the connection conductor 12 becomes a power feeding end 3a, and the high frequency power supply 4 is connected to the power feeding end 3a via a matching circuit 41. In addition, the other end, that is, a terminal end 3b is directly grounded. Moreover, the terminal end 3b may be grounded via a capacitor or a coil.

With the above configuration, the high frequency current IR can be made to flow from the high frequency power supply 4 to the antenna conductors 3 via the matching circuit 41. Usually, the high frequency is, but not limited to, 13.56 MHz for example.

<Configuration of Connection Conductor 12>

Next, the connection conductor 12 is described in detail with reference to FIGS. 3 to 7. Moreover, description of some seal members and the like is omitted in FIGS. 3 and 4.

Figure 3:
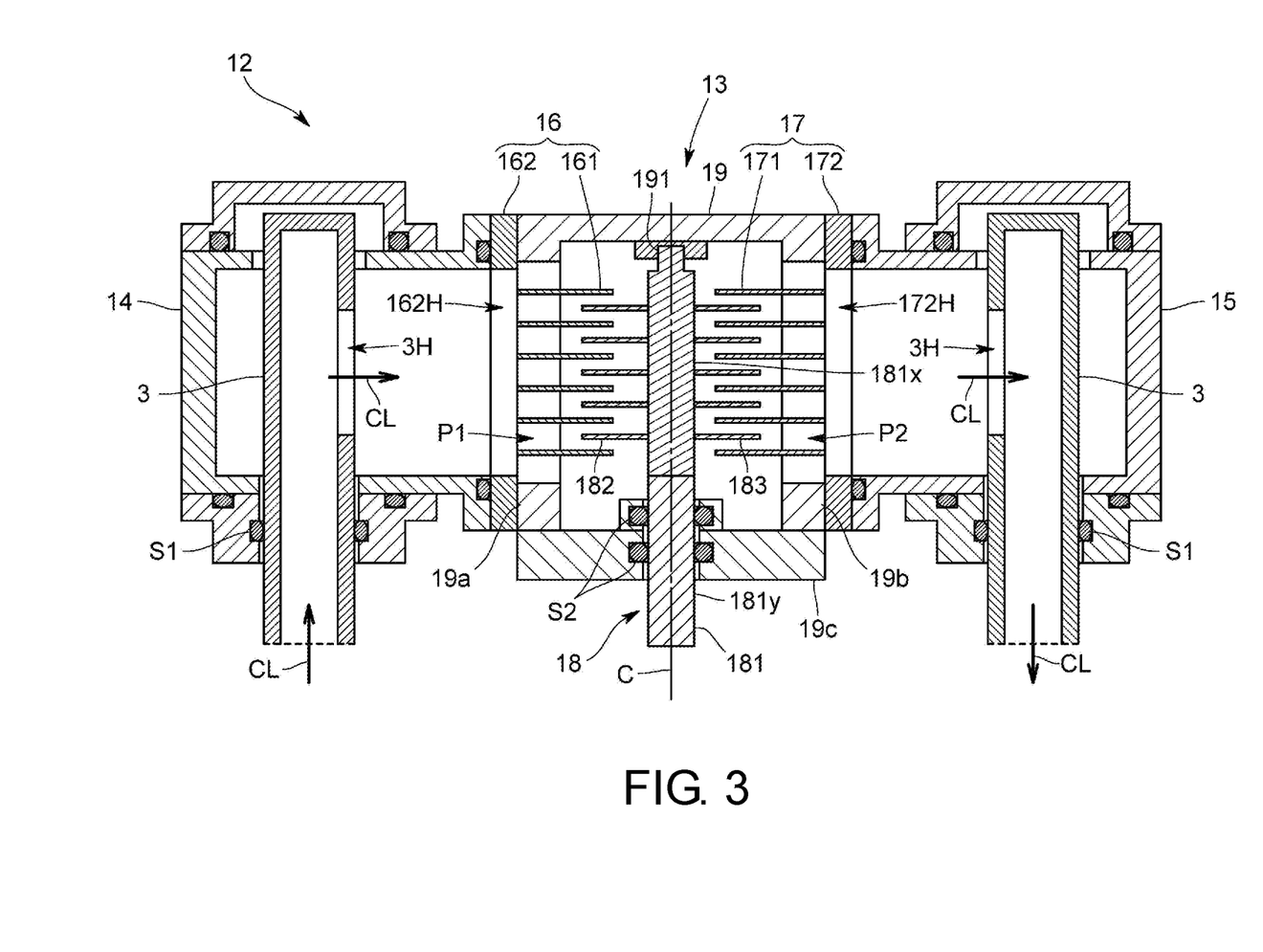
FIG. 3 is a cross-sectional view schematically showing a connection conductor of the above embodiment.
Figure 4:
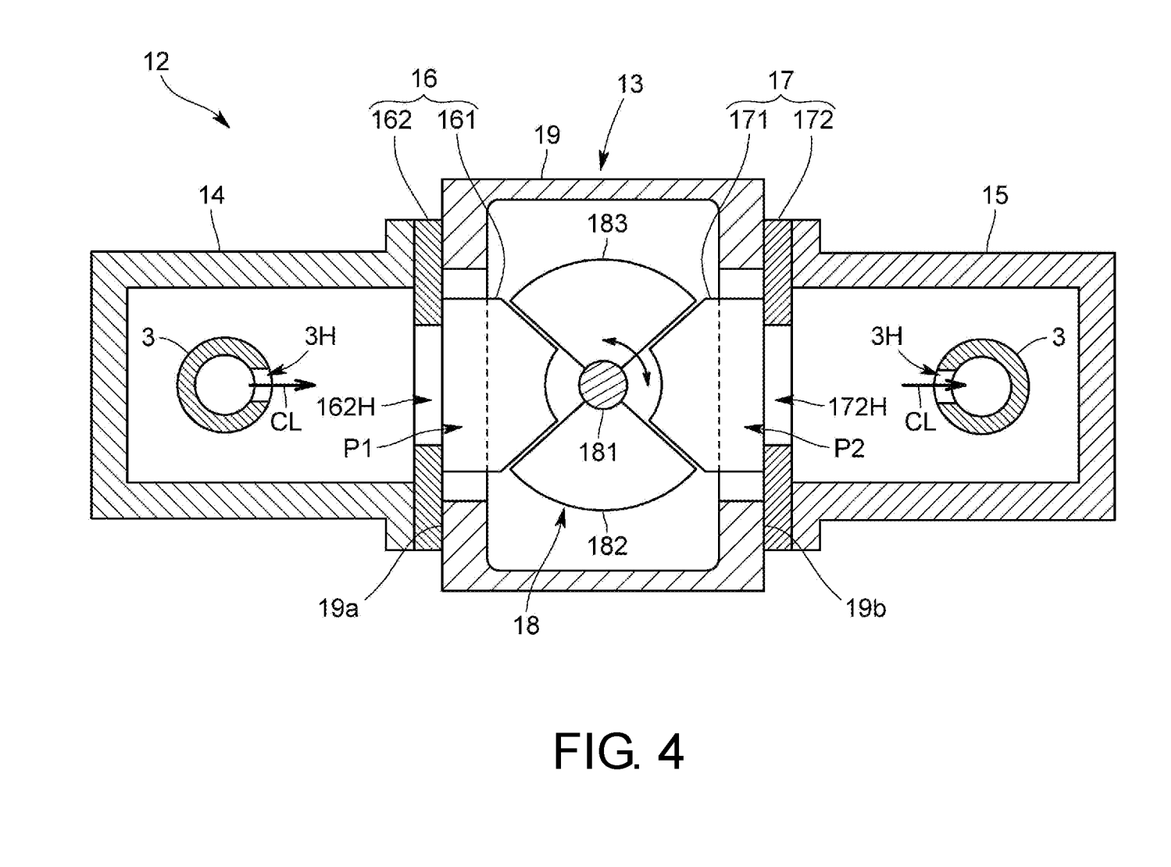
FIG. 4 is a longitudinal sectional view schematically showing the connection conductor of the above embodiment.
Figure 5:
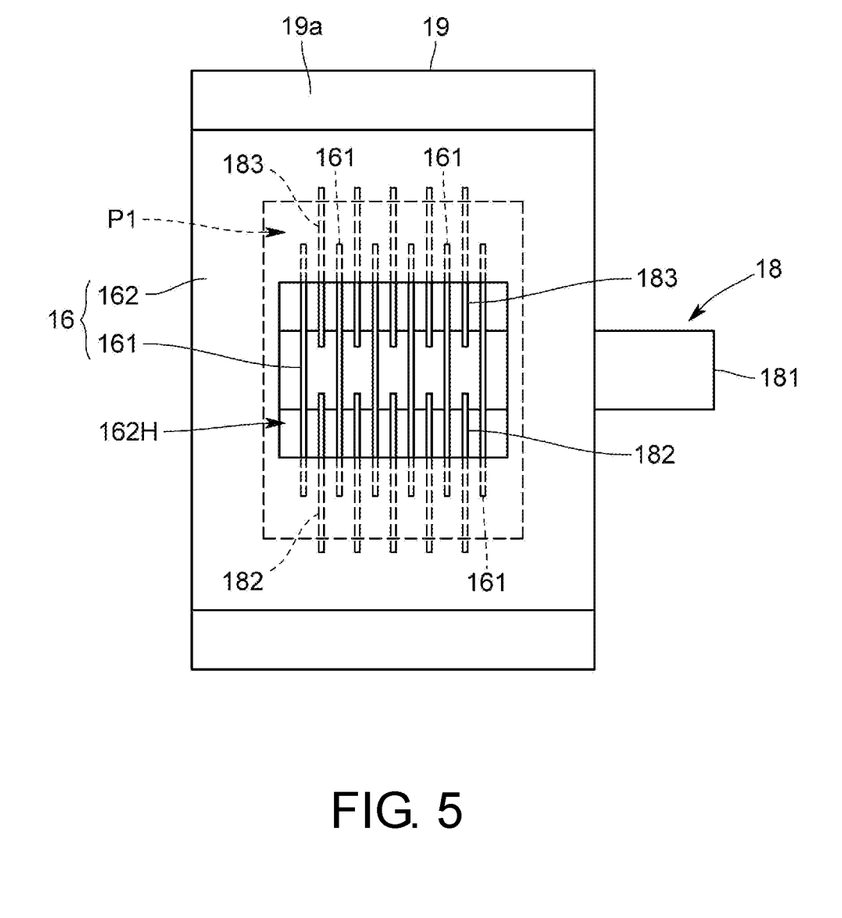
FIG. 5 is a side view of a variable capacitor of the above embodiment as seen from an inlet port side.

As shown in FIGS. 3 and 4, the connection conductor 12 has a variable capacitor 13 electrically connected to the antenna conductor 3, a first connection part 14 connecting the variable capacitor 13 and the end of one antenna conductor 3, and a second connection part 15 connecting the variable capacitor 13 and the end of the other antenna conductor 3.

The first connection part 14 and the second connection part 15 surround the ends of the antenna conductor 3 to thereby come into electrical contact with the antenna conductor 3 and guide the cooling liquid CL from an opening 3H formed at the end of the antenna conductor 3 to the variable capacitor 13. The material of the connection parts 14 and 15 is, for example, copper, aluminum, alloys thereof, stainless steel, or the like.

At the end of the antenna conductor 3, each of the connection parts 14 and 15 of the present embodiment is mounted in a liquid-tight manner closer to the vacuum container 2 side than the opening 3H via a seal member S1 such as an O-ring, and the outer side than the opening 3H is not restricted (see FIG. 3). This allows a slight inclination of the antenna conductor 3 with respect to the connection parts 14 and 15.

The variable capacitor 13 has a first fixed electrode 16 electrically connected to one antenna conductor 3, a second fixed electrode 17 electrically connected to the other antenna conductor 3, and a movable electrode 18 that forms a first capacitor with the first fixed electrode 16 and forms a second capacitor with the second fixed electrode 17.

The variable capacitor 13 of the present embodiment is configured such that the movable electrode 18 can change its electrostatic capacity by rotating about a predetermined rotation shaft C. Besides, the variable capacitor 13 includes a storage container 19 being insulative and storing the first fixed electrode 16, the second fixed electrode 17, and the movable electrode 18.

The storage container 19 has an inlet port P1 for introducing the cooling liquid CL from one antenna conductor 3 and an outlet port P2 for discharging the cooling liquid CL to the other antenna conductor 3. The inlet port P1 is formed on one side wall (a left side wall 19a in FIG. 3) of a storage container 19, and the outlet port P2 is formed on the other side wall (a right side wall 19b in FIG. 3) of the storage container 19. The inlet port P1 and the outlet port P2 are arranged at positions facing each other. Moreover, the storage container 19 of the present embodiment is formed in a substantially rectangular parallelepiped shape having a hollow portion inside. However, the storage container 19 may have another shape.

The first fixed electrode 16 and the second fixed electrode 17 are arranged at different positions around the rotation shaft C of the movable electrode 18. In the present embodiment, the first fixed electrode 16 is inserted into the storage container 19 from the inlet port P1 of the storage container 19. In addition, the second fixed electrode 17 is inserted into the storage container 19 from the outlet port P2 of the storage container 19. Accordingly, the first fixed electrode 16 and the second fixed electrode 17 are arranged at positions symmetrical with respect to the rotation shaft C.

The first fixed electrode 16 has a plurality of first fixed metal plates 161 arranged facing each other. In addition, the second fixed electrode 17 has a plurality of second fixed metal plates 171 arranged facing each other. The fixed metal plates 161 and 171 are arranged along the rotation shaft C at substantially equal intervals.

Besides, the plurality of first fixed metal plates 161 have the same shape and are supported by a first flange member 162. The first flange member 162 is fixed to the left side wall 19a of the storage container 19 in which the inlet port P1 is formed. Here, a through hole 162H communicating with the inlet port P1 is formed in the first flange member 162 (see FIG. 5). In addition, the plurality of second fixed metal plates 171 have the same shape and are supported by a second flange member 172. The second flange member 172 is fixed to the right side wall 19b of the storage container 19 in which the outlet port P2 is formed. Here, a through hole 172H communicating with the outlet port P2 is formed in the second flange member 172. The plurality of first fixed metal plates 161 and the plurality of second fixed metal plates 171 are arranged at positions symmetrical with respect to the rotation shaft C in a state of being fixed to the storage container 19.

Figure 6:
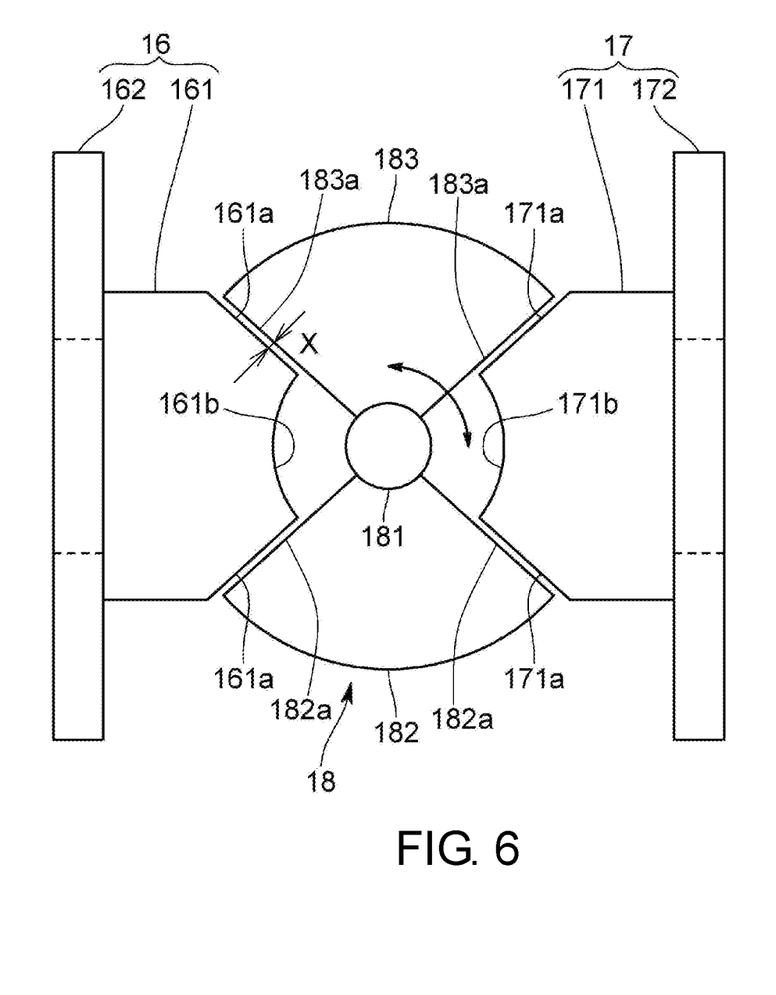
FIG. 6 is a schematic view showing a state in which a fixed metal plate and a movable metal plate of the above embodiment do not face each other.

In addition, the first fixed metal plate 161 and the second fixed metal plate 171 have a flat plate shape and is gradually reduced in width toward the rotation shaft C in a plan view, as shown in FIG. 6. Besides, in each of the fixed metal plates 161 and 171, end edges 161a and 171a having reduced width are formed along the radial direction of the rotation shaft C. Moreover, the angles formed by the end edges 161a and 171a facing each other are 90 degrees. In addition, front end edges 161b and 171b of the fixed metal plates 161 and 171 on the rotation shaft C side have an arc shape.

As shown in FIG. 4, the movable electrode 18 has a rotation shaft body 181 supported by a side wall (a front side wall 19c in FIG. 3) of the storage container 19 so as to be rotatable around the rotation shaft C, first movable metal plates 182 supported by the rotation shaft body 181 and facing the first fixed electrode 16, and second movable metal plates 183 supported by the rotation shaft body 181 and facing the second fixed electrode 17.

The rotation shaft body 181 has a linear shape extending along the rotation shaft C. The rotation shaft body 181 is configured such that one end thereof extends outward from the front side wall 19c of the storage container 19, and is rotatably supported by a seal member S2 such as an O-ring in the front side wall 19c of the storage container 19. Here, the rotation shaft body 181 is supported by two O-rings at two points in the front side wall. In addition, the other end of the rotation shaft 181 is rotatably in contact with a positioning recess 191 arranged on the inner surface of the storage container 19.

In addition, in the rotation shaft body 181, a portion 181x that supports the first movable metal plates 182 and the second movable metal plates 183 is formed of a conductive material such as metal, and a portion 181y that extends from the storage container 19 to the outside is formed of an insulating material made of resin and the like.

A plurality of the first movable metal plates 182 are arranged corresponding to the first fixed metal plates 161. Moreover, the first movable metal plates 182 have the same shape. In addition, a plurality of the second movable metal plates 183 are arranged corresponding to the second fixed metal plates 171. Moreover, the second movable metal plates 183 have the same shape. The movable metal plates 182 and 183 are respectively arranged along the rotation shaft C at substantially equal intervals. In addition, in the present embodiment, the movable metal plates 182 are sandwiched between the fixed metal plates 161, and the movable metal plates 183 are sandwiched between the fixed metal plates 171. In FIG. 3, the number of the fixed metal plates 161 and 171 is six for each, and the number of the movable metal plates 182 and 183 is five for each, but the number is not limited hereto. Moreover, the gap between the movable metal plates 182, 183 and the fixed metal plates 161, 171 is, for example, 1 mm.

As shown in FIG. 4, the first movable metal plate 182 and the second movable metal plate 183 are arranged at positions symmetrical with respect to the rotation shaft C and have the same shape. Specifically, as shown in FIG. 6, each of the movable metal plates 182 and 183 has a fan shape that expands radially outward from the rotation shaft C in a plan view. In the present embodiment, the movable metal plates 182 and 183 have a fan shape with a central angle of 90 degrees.

Figure 7:
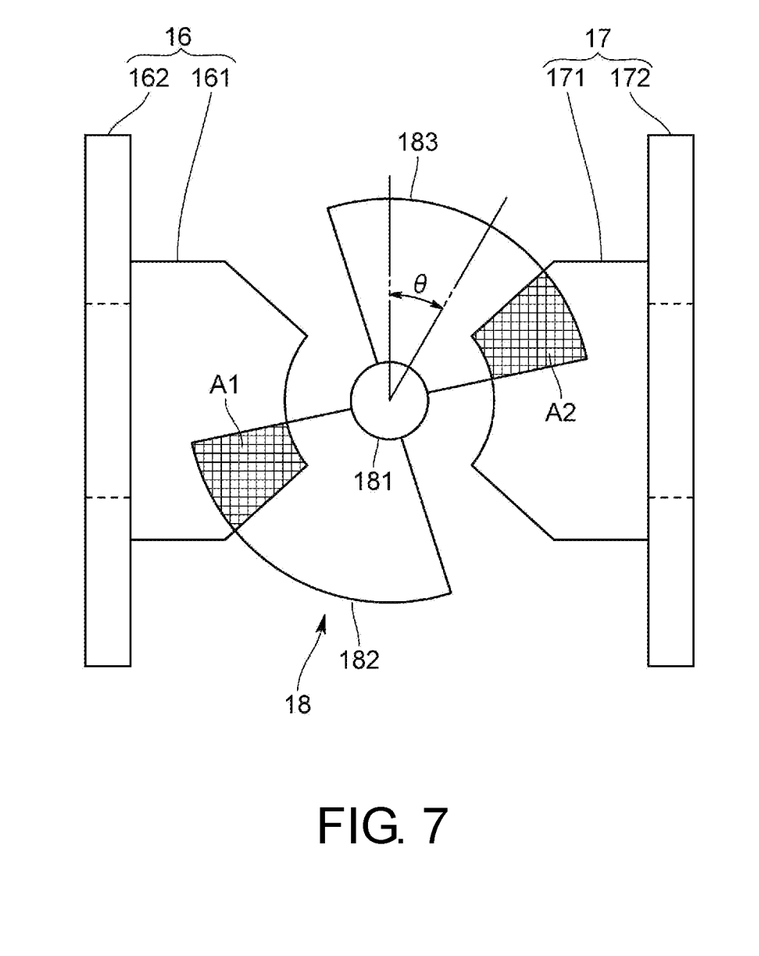
FIG. 7 is a schematic view showing a state in which the fixed metal plate and the movable metal plate of the above embodiment face each other.

As shown in FIG. 7, by rotating the movable electrode 18 in the variable capacitor 13 configured as above, the facing area (a first facing area A1) of the first fixed metal plate 161 and the first movable metal plate 182 is varied, and the facing area (a second facing area A2) of the second fixed metal plate 171 and the second movable metal plate 183 is varied. In the present embodiment, the first facing area A1 and the second facing area A2 are varied in the same manner.

In addition, the front end edges 161*b* and 171*b* on the rotation shaft C side of the fixed metal plates 161 and 171 have an arc shape, and the first facing area A1 and the second facing area A2 are varied in proportion to the rotation angle θ of the movable electrode 18 by rotating the movable electrode 18.

In addition, in the present embodiment, as shown in FIG. 6, when the fixed metal plates 161 and 171 do not face the movable metal plates 182 and 183, a gap X is arranged between expanding end edges 182*a*, 183*a* of the movable metal plates 182, 183 and the reducing end edges 161*a*, 171*a* of the fixed metal plates 161, 171 in a plan view. Accordingly, the movable electrode 18 can be removed in the axial direction. In the present embodiment, the movable electrode 18 is removed by removing, along the axial direction, the front side wall 19*c* supporting the movable electrode 18.

In the above configuration, when the cooling liquid CL flows in from the inlet port P1 of the storage container 19, the inside of the storage container 19 is filled with the cooling liquid CL. At this time, the space between the first fixed metal plates 161 and the first movable metal plates 182 is filled with the cooling liquid CL, and the space between the second fixed metal plates 171 and the second movable metal plates 183 is also filled with the cooling liquid CL. Accordingly, the cooling liquid CL becomes the dielectric of the first capacitor and the dielectric of the second capacitor. In the present embodiment, the electrostatic capacity of the first capacitor is the same as the electrostatic capacity of the second capacitor. In addition, the first capacitor and the second capacitor configured in this way are connected in series, and the electrostatic capacity of the variable capacitor 13 is half of the electrostatic capacity of the first capacitor (or the second capacitor).

Here, in the present embodiment, the direction in which the first fixed electrode 16 and the second fixed electrode 17 face the movable electrode 18 is orthogonal to the direction in which the inlet port P1 faces the outlet port P2. That is, the fixed metal plates 161, 171 and the movable metal plates 182, 183 are arranged along the direction in which the inlet port P1 faces the outlet port P2. With this configuration, the cooling liquid CL easily flows inside the storage container 19. As a result, the replacement of the cooling liquid CL in the storage container 19 is facilitated, and the variable capacitor 13 can be cooled efficiently. In addition, the cooling liquid CL that has flowed in from the inlet port P1 easily flows into the space between the fixed metal plates 161, 171 and the movable metal plates 182, 183, and easily flows out from the space between the fixed metal plates 161, 171 and the movable metal plates 182, 183. As a result, the replacement of the cooling liquid between the fixed metal plates 161, 171 and the movable metal plates 182, 183 is facilitated, and the temperature change of the cooling liquid CL serving as the dielectric is suppressed. Accordingly, the electrostatic capacity of the variable capacitor 13 is easily kept constant. Furthermore, bubbles are less likely to stay between the fixed metal plates 161, 171 and the movable metal plates 182, 183.

Effects of Present Embodiment

According to the plasma processing device 100 of the present embodiment configured as above, the antenna conductor 3 can be cooled by the cooling liquid CL, and thus the plasma P can be stably generated. In addition, the dielectric of the variable capacitor 13 is constituted of the cooling liquid CL flowing through the antenna conductor 3, and thus the unexpected fluctuation in the electrostatic capacity of the variable capacitor 13 can be suppressed while cooling the variable capacitor 13.

In addition, in the present embodiment, it is not necessary to connect an external circuit element such as the antenna conductor 3 or the ground to the movable electrode 18. Thus, this eliminates the need for a connector in which a slider (brush) that brings the movable electrode 18 into contact with the external circuit element is applied, and can reduce connection failure caused by the connector in which the slider is applied.

Furthermore, in the present embodiment, the first fixed electrode 16 and the second fixed electrode 17 are arranged at different positions around the rotation shaft C, so that the dimension of the rotation shaft C in the axial direction can be made compact.

Moreover, in the present embodiment, each fixed electrode 16, 17 has a plurality of fixed metal plates 161, 171, and the movable electrode has a plurality of movable metal plates 182, 183, so that the maximum value of the facing area between the electrodes can be increased without increasing the areas of the fixed metal plates 161, 171 and the movable metal plates 182, 183.

Other Modified Embodiments

Moreover, the present invention is not limited to the above embodiment.

In the above embodiment, the movable electrode rotates around the rotation shaft C. However, the movable electrode may also slide in one direction. Here, as the configuration in which the movable electrode slides, the movable electrode may slide in a direction orthogonal to the facing direction between the movable electrode and the fixed electrode to change the facing area, or the movable electrode may slide along the facing direction between the movable electrode and the fixed electrode to change the facing distance.

In addition, the shapes of the movable metal plate and the fixed metal plate are not limited to the above embodiment, and various shapes can be used.

Furthermore, in the above embodiment, the variable capacitor is arranged between the adjacent antenna conductors. However, the variable capacitor may also be arranged between the antenna conductor and the ground. In this case, the first fixed electrode is electrically connected to the antenna conductor, and the second fixed electrode is grounded.

Besides, in the above embodiment, the antenna conductor has a linear shape. However, the antenna conductor may also have a curved or bent shape. In this case, the metal pipe may have a curved or bent shape, or the insulating pipe may have a curved or bent shape.

In addition, the present invention is not limited to the above embodiment, and various modifications can be made without departing from the spirit of the present invention.

What is claimed is:

1. A plasma processing device for generating plasma in a vacuum container and processing a substrate by using the plasma, comprising:
   an antenna conductor and an adjacent second antenna conductor through which a high frequency current is caused to flow to generate plasma, and
   a variable capacitor electrically connected to the antenna conductor and the adjacent second antenna conductor, and communicating with the antenna conductor and the adjacent second antenna conductor, wherein the antenna conductor and the adjacent second antenna conductor respectively have therein a flow path in which a cooling liquid flows, and the cooling liquid flows from an inside of the antenna conductor to the variable capacitor and out to an inside of the adjacent second antenna conductor, and a dielectric of the variable capacitor is constituted of the cooling liquid flowing through the antenna conductor and the adjacent second antenna conductor.

2. The plasma processing device according to claim 1, wherein the variable capacitor has:

a first fixed electrode electrically connected to the antenna conductor, a second fixed electrode electrically connected to the adjacent second antenna conductor or grounded, and a movable electrode that forms a first capacitor with the first fixed electrode and forms a second capacitor with the second fixed electrode.

3. The plasma processing device according to claim 2, wherein the movable electrode rotates about a predetermined rotation shaft, and the first fixed electrode and the second fixed electrode are arranged at different positions around the rotation shaft.

4. The plasma processing device according to claim 3, wherein the first fixed electrode and the second fixed electrode are arranged at positions symmetrical with respect to the rotation shaft and have the same shape, the movable electrode has a first movable metal plate facing the first fixed electrode, and a second movable metal plate facing the second fixed electrode, and the first movable metal plate and the second movable metal plate are arranged at positions symmetrical with respect to the rotation shaft and have the same shape.

5. The plasma processing device according to claim 4, wherein the first fixed electrode and the second fixed electrode each have a plurality of fixed metal plates arranged facing each other, a plurality of the first movable metal plates are arranged corresponding to the plurality of fixed metal plates that form the first fixed electrode, and a plurality of the second movable metal plates are arranged corresponding to the plurality of fixed metal plates that form the second fixed electrode.

6. The plasma processing device according to claim 5, wherein each of the plurality of first movable metal plates and each of the second movable metal plates have a fan shape that expands radially outward from the rotation shaft in a plan view, each of the plurality of fixed metal plates has a shape which is gradually reduced in width toward the rotation shaft in a plan view, a reduced end edge of each of the plurality of fixed metal plates is formed along a radial direction of the rotation shaft, and a front end edge on a rotation shaft side has an arc shape.

7. The plasma processing device according to claim 2, wherein the variable capacitor comprises a storage container being insulative and storing the first fixed electrode, the second fixed electrode and the movable electrode, the storage container has an inlet port for introducing the cooling liquid and an outlet port for discharging the cooling liquid, and the inlet port and the outlet port are arranged at positions facing each other.

8. The plasma processing device according to claim 7, wherein the direction in which the first fixed electrode and the second fixed electrode face the movable electrode is orthogonal to the direction in which the inlet port faces the outlet port.

9. The plasma processing device according to claim 7, wherein the first fixed electrode is inserted into the storage container from one of the inlet port or the outlet port, and the second fixed electrode is inserted into the storage container from the other of the inlet port or the outlet port.

10. The plasma processing device according to claim 1, wherein the antenna conductor and the adjacent second antenna conductor are arranged penetrating the vacuum container, and the variable capacitor is electrically connected to an end of the antenna conductor and an end of the adjacent second antenna conductor extending to the outside the vacuum container.

11. The plasma processing device according to claim 10, wherein the variable capacitor electrically connects the ends of the antenna conductor and the adjacent second antenna conductor extending to the outside of the vacuum container, and connects the flow paths of the antenna conductor and the adjacent second antenna conductor.

* * * * *